United States Patent [19]

Murata et al.

[11] Patent Number: 5,162,797

[45] Date of Patent: Nov. 10, 1992

[54] VITERBI DECODER

[75] Inventors: Junichi Murata; Toshimasa Hamada, both of Hyogo, Japan

[73] Assignee: Mitsubishi Denki Kabushiki Kaisha, Tokyo, Japan

[21] Appl. No.: 700,392

[22] Filed: May 15, 1991

[30] Foreign Application Priority Data

May 18, 1990 [JP] Japan .................. 2-128208

[51] Int. Cl.$^5$ ........................................... H03M 13/12
[52] U.S. Cl. ..................................... 341/107; 341/106;
371/44
[58] Field of Search ................ 341/75, 79, 94, 106,
341/107; 371/43, 44, 45

[56] References Cited

U.S. PATENT DOCUMENTS

| | | | |
|---|---|---|---|
| 4,483,012 | 11/1984 | Wei ........................................ | 371/43 |
| 4,527,279 | 7/1985 | Yasuda et al. ........................ | 375/114 |
| 4,583,078 | 4/1986 | Shenoy et al. ....................... | 341/51 |
| 4,606,027 | 8/1986 | Otani .................................... | 371/43 |
| 4,623,999 | 11/1986 | Patterson ............................. | 371/43 |
| 4,677,624 | 6/1987 | Betts et al. .......................... | 371/43 |
| 4,709,377 | 11/1987 | Martinez et al. .................... | 375/75 |
| 4,757,506 | 7/1988 | Heichler .............................. | 371/43 |
| 4,763,328 | 8/1988 | Shimoda et al. ................... | 371/3 |
| 4,777,636 | 10/1988 | Yamashita et al. ................ | 371/43 |
| 4,905,317 | 2/1990 | Suzuki et al. ....................... | 341/51 |
| 5,043,728 | 8/1991 | Hoshi et al. ........................ | 341/106 |

*Primary Examiner*—Howard L. Williams
*Attorney, Agent, or Firm*—Rothwell, Figg, Ernst & Kurz

[57] ABSTRACT

The inventive VITERBI decoder employs a memory for delivering a new path-metric and path selecting information. The memory stores path-metrics and path selecting information corresponding to all combinations of all possible values of input data, path-metric and control signal. The memory has its address lines connected with an input data output line, branch information output line and output line for a metric of the past.

5 Claims, 5 Drawing Sheets

FIG. 4

| ADDRESS | | | | | DATA | |
|---|---|---|---|---|---|---|
| A | B | C | D | E | F | G |
| ⋮ | ⋮ | ⋮ | ⋮ | ⋮ | ⋮ | ⋮ |
| 00 | 0000 | 10 | 0101 | 1001 | 1 | 0101 |
| 00 | 0000 | 10 | 0101 | 1010 | 1 | 0101 |
| 00 | 0000 | 10 | 0101 | 1011 | 1 | 0101 |
| ⋮ | ⋮ | ⋮ | ⋮ | ⋮ | ⋮ | ⋮ |
| 00 | 0100 | 11 | 0111 | 0011 | 0 | 0100 |
| ⋮ | ⋮ | ⋮ | ⋮ | ⋮ | ⋮ | ⋮ |

A: INITIALIZATION AND SPECIFICATION FOR TERMINATION (PART OF CONTROL SIGNAL 9)

B: SPECIFICATION OF A PAIR OF BRANCHES WHICH UNDERGOE COMPUTATION (PART OF CONTROL SIGNAL 9)

C: VALUES AT DATA INPUT PORT (CODE OF RECEIVED SYMBOL)

D: PATH-METRIC OF THE PAST (CORRESPONDING TO ONE BRANCH)

E: PATH-METRIC OF THE PAST (CORRESPONDING TO ANOTER BRANCH)

F: PATH SELECTING INFORMATION

G: NEW PATH-METRIC

FIG. 5

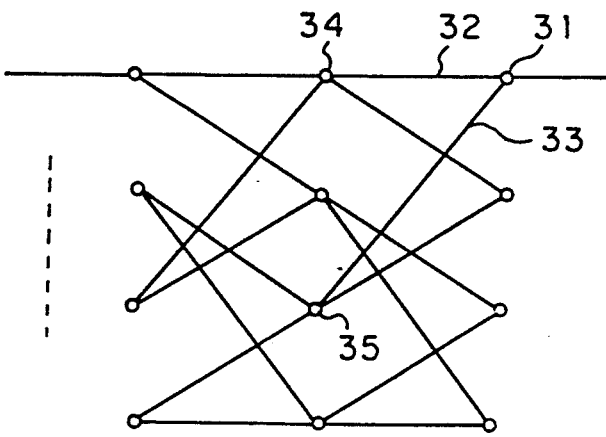

VITERBI DECODER

BACKGROUND OF THE INVENTION

1. Field of the Invention

The present invention relates to a VITERBI decoder used for error correction in such equipment as a digital mobile communication terminal which is required to be more compact and faster in processing.

2. Description of the Prior Art

FIG. 1 is a block diagram of a VITERBI decoder, in which indicated by 1 is a data input port, 2 is a computation unit which implements the computation for the path and metric, 3 is a metric memory capable of revising the path-metric, 4 is a decoded data delivery port, 5 is a path memory which stores path selecting information, and 6 is a controller which controls the data input port 1, computation unit 2, metric memory 3, and other functional blocks. Indicated by 7 is external input data, 8 is input data processed by the data input port 1 and delivered to the computation unit 2, 9 is a control signal, 10 is a path-metric of the past which is read out of the metric memory 3 and delivered to the computation unit 2, 11 is a new path-metric which is read out of the computation unit 2 and written to the metric memory 3, 12 is path selecting information which is provided by the computation unit 2 and written to the path memory 5, and 13 is decoded data which is taken out of the decoded data output port 4 and delivered to the outside.

FIG. 2 is a block diagram showing the computation unit 2, in which the same or equivalent portions as in FIG. 1 are referred to by the common symbols. Indicated by 14a and 14b are branch metric computation circuits, 15a and 15b are path-metric computation circuits, 16 is a metric comparison circuit which compares two path-metrics, and 17 is a path selection circuit which selects one of two path-metrics based on the path selecting information 12 provided by the metric comparison circuit 16.

Next, the operation will be explained.

In the VITERBI decoder shown in FIG. 1, the metric memory 3 and path memory 5 are initialized at the beginning. When a symbol in the input data 7 is entered to the data input port 1, the data input port 1 introduces the symbol in response to the timing signal included in the control signal. The data input port 1 holds the symbol until the computation unit 2 completes the computations for all branches.

The computation unit 2 operates in accordance with the control signal 9 provided by the controller 6. Namely, the computation unit 2 bases its operation on the VITERBI algorithm in implementing the computation of metric and path for the path-metric 10 of the past read out of the metric memory 3 and the control signal 9. A resulting new path-metric 11 and path selecting information 12 are stored in the metric memory 3 and path memory 5, respectively. The decoded data 13 is delivered through the decoded data output port 4 based on the contents of the path memory 5.

Next, the operation of the computation unit 2 shown in FIG. 2 will be explained. The branch metric computation circuits 14a and 14b calculate the branch metric for the input symbol in accordance with the control signal 9. Specifically, the branch metric computation circuit 14a calculates the branch metric of one branch (an immediate branch indicated by the control signal 9) for a symbol in the input data 8. The branch metric computation circuit 14b calculates the branch metric of another branch (indicated by the control signal 9) for an immediate symbol.

Subsequently, the path-metric computation circuits 15a and 15b calculate new path-metrics based on the calculated branch metrics and each path-metric 10 of the past corresponding to each branch read out of the metric memory 3. Specifically, the path-metric computation circuit 15a sums the path-metric 10 (read out of the metric memory 3 in accordance with the control signal 9 from the controller 6) corresponding to the start point of the branches which have been treated in the computation by the branch metric computation circuit 14a and the branch metric calculated by the branch metric computation circuit 14a thereby to evaluate a new path-metric. The path-metric computation circuit 15b sums the path-metric 10 corresponding to the start point of the branches which have been treated in the computation by the branch metric computation circuit 14b and the branch metric calculated by the branch metric computation circuit 14b thereby to evaluate a new path-metric. The computations of the above-mentioned two path-metrics are carried out for each status on the Trellis diagram (i.e., possible states of the decoder) at a time point after the immediate entry of the symbol. The controller 6 issues the control signal 9, indicative of the computation of the two branches in the states after the entry of symbol on the Trellis diagram, to the metric computation circuits 14a and 14b.

Subsequently, the metric comparison circuit 16 compares the two path-metrics, and produces the path selecting information 12 based on the result of computation. A path selection circuit 17 selects a path-metric depending on the path selecting information 12, i.e., the smaller path-metric, and delivers it as a new path-metric 11. This selection process takes place for all possible states of the decoder.

The conventional VITERBI decoder arranged as described above is intricate in circuit configuration and therefore unsuitable for size reduction, and in addition it is difficult to speed up the process due to cumulative process times expended by individual circuits. Moreover, the content of computation is dependent on each circuit, and it cannot easily cope with a change in computation. The technique which resembles the foregoing conventional VITERBI decoder is described in the above-mentioned U.S. Pat. No. 4,583,078.

SUMMARY OF THE INVENTION

The present invention is intended to overcome the foregoing prior art deficiencies, and its prime object is to provide a VITERBI decoder which enables the simplification of circuit arrangement, speed-up of computation, and adaptation to arbitrary computations and their changes.

The inventive VITERBI decoder is characterized in that the conventional assortment of computation circuits are replaced with a memory, with the address input lines of the memory being correspondent to input data which represents the input lines of computation unit, the metric of the past and control signal from the controller, and with the data output lines of memory being correspondent to a new path-metric and path selecting information which represent the output lines of the computation unit, and with the result of prior computation being stored in the memory area addressed by the input signal.

The computation unit based on this invention has its memory address established at the settlement of the input signal, and therefore by reading the result of prior computation out of the address location, the result of computation is delivered promptly.

The above and further objects and novel features of the invention will more fully appear from the following detailed description when the same is read in connection with the accompanying drawing. It is to be expressly understood, however, that the drawings are for purpose of illustration only and are not intended as a definition of the limits of the invention.

BRIEF DESCRIPTION OF THE DRAWINGS

FIG. 4 is an explanatory diagram showing an example of data stored in the memory;

FIG. 5 is an example of Trellis chart;

DETAILED DESCRIPTION OF THE PREFERRED EMBODIMENTS

Figure 1:
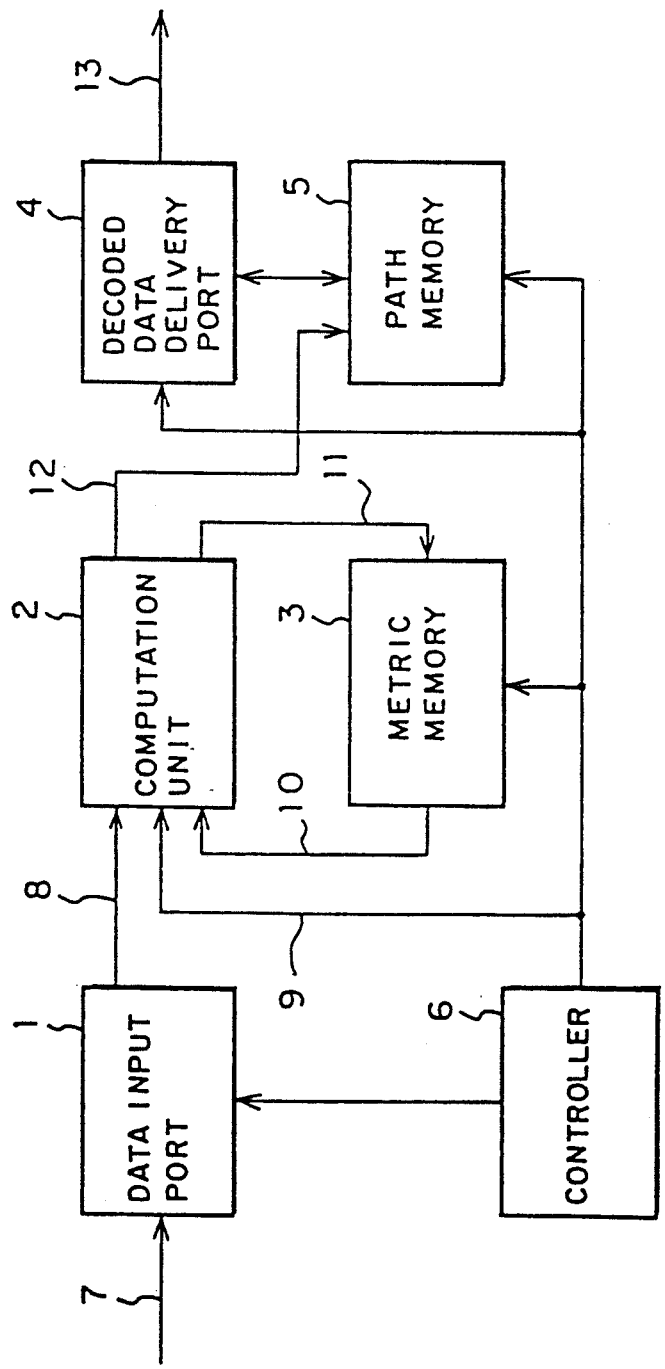
FIG. 1 is a block diagram showing the VITERBI decoder.
Figure 2:
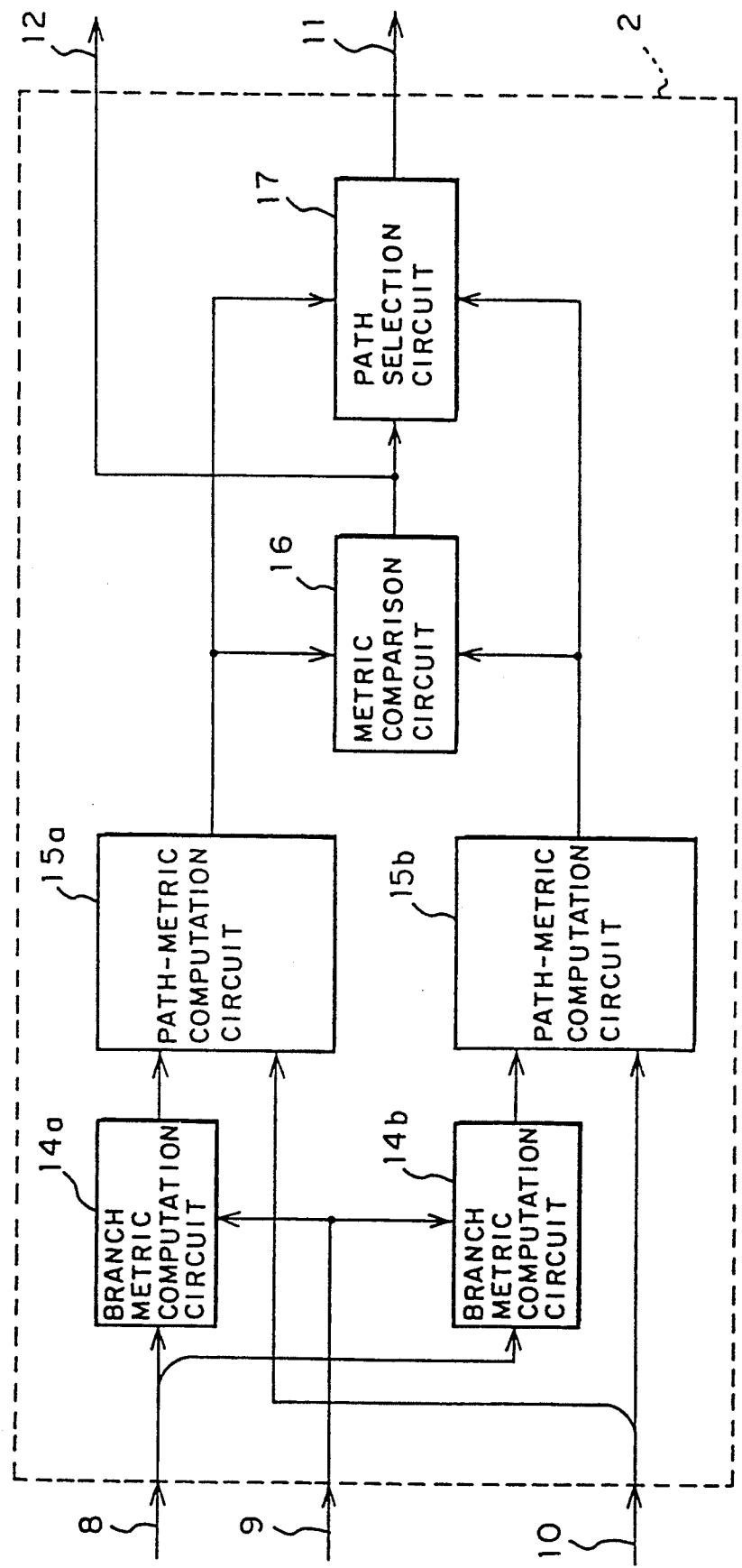
FIG. 2 is a block diagram showing the conventional computation unit.
Figure 3:
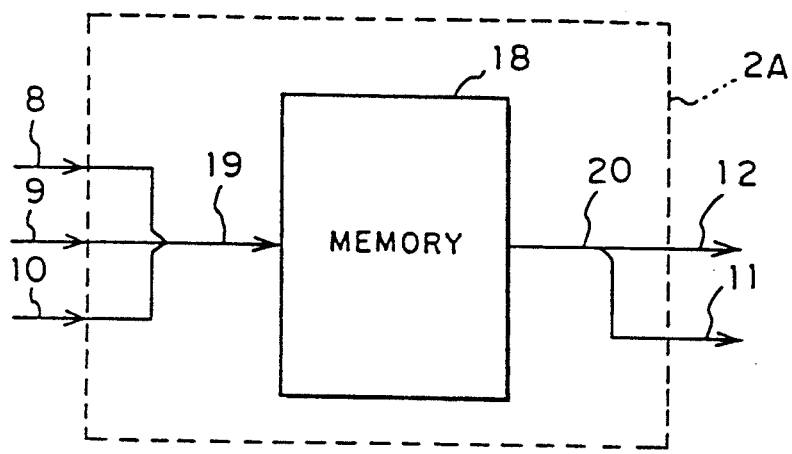
FIG. 3 is a block diagram showing the computation unit used in the VITERBI decoder based on an embodiment of the present invention.

A preferred embodiments of the present invention will now be described in detail referring to the accompanying drawings. In FIG. 3, indicated by 18 is a memory which is a read-only memory (ROM), 19 are address input lines to the ROM 18, and 20 are data output lines from the ROM 18. The address input lines 19 carry an input symbol 8 as input data of the VITERBI decoder, a control signal 9 and path-metric 10 of the past, while the data output lines 20 carry a new path-metric 11 and path selecting information 12 to be delivered. The ROM 18 stores, in advance of operation, the results of computations for all combinations of possible values taken by the input symbol 8, control signal 9 and path-metric 10 of the past entered over the address input lines 19 at bit positions corresponding to the path-metric 11 and path selecting information 12 at a memory location which is addressed uniquely by each combination. The computation unit 2A shown in FIG. 3 is used in place of the computation unit 2 in the VITERBI decoder shown in FIG. 1. Namely, the VITERBI decoder based on the present invention is arranged as shown in FIG. 1, with the computation unit 2 being replaced with the computation unit 2A.

The following explains the method of creating data to be stored in the ROM 18.

(1) A metric between a code corresponding to a branch in a set of branches indicated by the control signal 9 and a code constituting the input symbol is calculated.

(2) A metric of the branch is added to a path-metric of the past corresponding to the branch.

(3) The path-metric obtained as a result of addition is rendered the adjustment in accordance with the control signal.

(4) A smaller path-metric is selected from the path-metrics to be assigned to a new path-metric 11 in the data, and information indicative of the selected branch of smaller value is assigned to be the path selecting information 12 in the data.

(5) The processes of item (1) through (5) are repeated for all combinations of possible values taken by the code which constitutes the input symbol, the code of branch, the control signal, and path-metrics of the past.

Next, the operation will be explained.

In the operation of the VITERBI decoder, as has been briefed in connection with the prior art, once an input symbol 8, control signal 9, and path-metrics 10 of the past of a set of branches are determined, the computation unit 2A has its address input lines 19 to the ROM 18 established, and the result of computation which has been stored in advance is read out and placed intact on the data output lines 20. In this manner, a new path-metric 11 and path selecting information 12 can be obtained, instead of repeating the computation at each signal input FIG. 4 is an explanatory diagram showing an example of the relation between the address and data in the ROM 18, and FIG. 5 shows an example of the Trellis diagram. The diagram of FIG. 5 is assumed to be a process for obtaining a new path-metric 11 and path selecting information 12 pertinent to a state 31. In this case, the address input lines 19 are given the control signals 9 indicative of branches 32 and 33, the input symbol held by the data input port 1, the path-metric for the state 34 at the start point of the branch 32, and the path-metric for the state 35 at the start point of the branch 33. In response to the values on the address input lines 19, data which has been stored in advance in the ROM 18 is read out and delivered. The output data is a new path-metric 11 which is the path selecting information 12 indicative of the selection of branch 32 or 33 added by the branch metric of the selected branch 32 or 33.

The computation unit 2A of this embodiment does not need to repeat the computation at each signal input, and the computation time can be reduced for the speed-up of operation. It requires only connection of 8-12 input/output lines and eliminates the need of wiring among computation circuits, and the circuit can be simplified. It can deal with arbitrary computations, in which a result of computation is produced uniquely for an input, that would be difficult to implement by the combinational use of individual computation circuits. The content of computation can readily be altered by revising the contents of the ROM 18.

Figure 6:
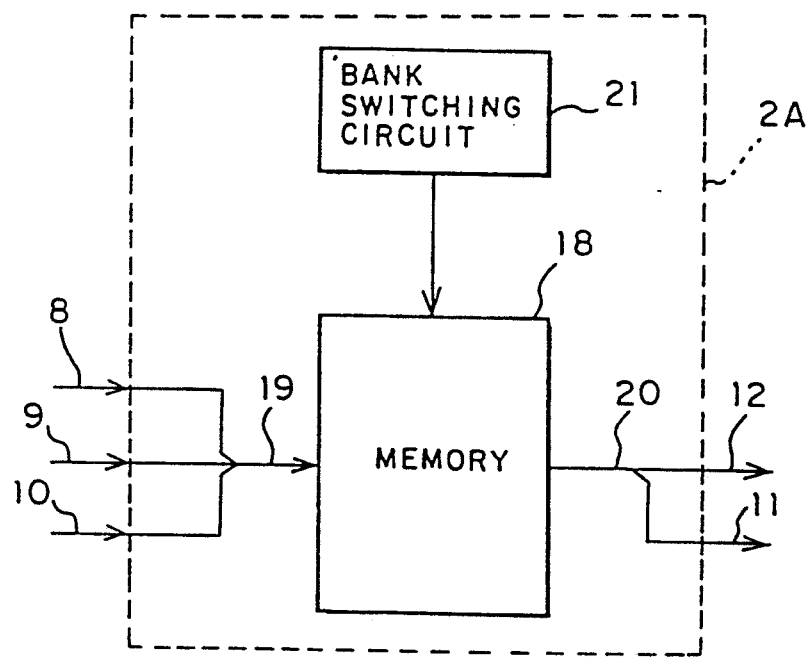
FIG. 6 is a block diagram showing the computation unit based on another embodiment of the present invention.

FIG. 6 shows another embodiment of the present invention, in which a bank switching circuit 21 is added to the ROM 18 in FIG. 3. This arrangement enables the instantaneous alteration of computation through bank switching without the need of halting the operation of the VITERBI decoder Even in the case of the alteration of the generation polynomial during the coding operation by the encoder which uses the convolutional code, and in the case of occurence of variations in state of a transmission path when transmission date is regenerated with assuming that the transmission path is a convolutional code, the decoder can keep abreast of the alteration. In this case, multiple sets of data for all kinds of generation polynomial are stored for the individual banks in the ROM 18.

Figure 7:
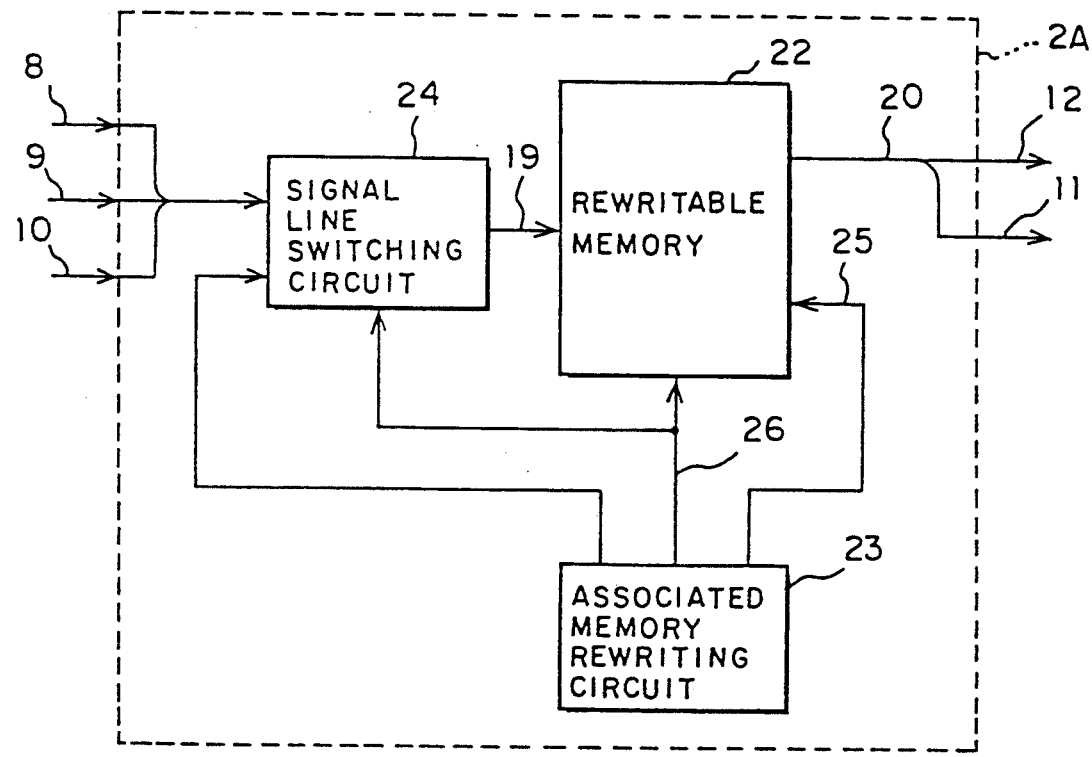
FIG. 7 is a block diagram showing the computation unit based on a further embodiment of the present invention.

Although in the foregoing embodiment the ROM 18 is used as a memory, an alternative arrangement is the use of a read-write memory (RAM) or other rewritable memory 22 and the associated memory rewriting circuit 23 and signal line switching circuit 24, as shown in FIG. 7, so that the memory contents can be revised by using the address input line 19, data input line 25 and write control line 26, and it becomes possible to alter the computation arbitrarily to meet the purpose. This arrangement is particularly useful for altering the content of computation to make adaptive to the ever-changing error erupting situation in such a case of mobile communication.

The readiness of the alteration of computation is further enhanced through the appropriate adoption of memory control among the bank switching scheme, dualport scheme, independent read/write access scheme, etc. for the rewritable memory 22 in FIG. 7.

According to the present invention, as described above, the conventional assortment of computation circuits are replaced with a memory, with the address input lines of the memory being correspondent to input data which represents the input lines of computation unit, metrics of the past and control signals from the controller, and with the data output lines of memory being correspondent to a new path-metric and the path selecting information which represent the output lines of the computation unit, and with the result of prior computation being stored in the memory area addressed by the input signal. Consequently, the metric corresponding to input data and data pertinent to a path can be provided promptly by the computation unit. In addition, the content of computation can readily be altered by revising the memory contents.

What is claimed is:

1. A VITERBI decoder comprising:
    a data input port which introduces input data and holds the data;
    a metric storage which stores path-metrics in such a fashion that the path-metric can be revised and which outputs path-metric as a preceding path-metric;
    a computation unit which receives said preceding path-metric from said metric-storage and which receives from a controller a control signal indicating each branch which is to be the object of computation for outputting a new path-metric to be stored in said metric storage and for outputting path selecting information;
    a path storage in which said path selecting information outputted by said computation unit is stored; and
    a decoded data delivery port which delivers decoded data based on path selecting information read out of said path storage,
    said computation unit including a memory which stores new path-metrics and path selecting information based on the metric of each branch as indicated by the control signal and the preceding metric for each branch corresponding to all combinations of possible values taken by the input data, the path-metric and the control signal and which outputs to data output lines a new path-metric and path selecting information in response to the input data, the preceding path-metric and the control signal placed on the address input lines.

2. A VITERBI decoder according to claim 1, wherein said memory comprises a ROM which stores path-metrics and path selecting information corresponding to all combinations of all possible values of input data, all possible values of path-metric and all possible values of control signal.

3. A VITERBI decoder according to claim 1, wherein said computation unit includes a bank switching circuit which switches banks of said memory, each bank having data corresponding to a distinct VITERBI code.

4. A VITERBI decoder according to claim 1, wherein said memory comprises a RAM which stores new path-metrics and path selecting information, and wherein said computation unit includes a memory rewriting circuit which stores data in said RAM, and a signal line switching circuit which connects the address input lines of said RAM to the address output lines of said memory rewriting circuit when data is stored in said RAM.

5. A VITERBI decoder according to claim 4, wherein said memory uses a bank switching scheme or dual-port scheme for independent read/write of memory contents

* * * * *

UNITED STATES PATENT AND TRADEMARK OFFICE
CERTIFICATE OF CORRECTION

PATENT NO. : 5,162,797
DATED : November 10, 1992
INVENTOR(S) : Junichi Murata et al.

It is certified that error appears in the above-identified patent and that said Letters Patent is hereby corrected as shown below:

```
Fig. 4, at "B", "UNDERGOE" should be --UNDERGOES--.
        at "E", "ANOTER" should be --ANOTHER--.

Col. 2, line 26 "symbol" should be --symbol.--.

Col. 4, line 21 "input" should be --input.--.

Col. 5, line 15 "dualport" should be --dual-port--.
```

Signed and Sealed this

Nineteenth Day of October, 1993

Attest:

BRUCE LEHMAN

Attesting Officer     Commissioner of Patents and Trademarks